(12) United States Patent
Fujimaki et al.

(10) Patent No.: US 9,796,053 B2
(45) Date of Patent: *Oct. 24, 2017

(54) HIGH-TEMPERATURE LEAD-FREE SOLDER ALLOY

(71) Applicant: SENJU METAL INDUSTRY CO., LTD., Tokyo (JP)

(72) Inventors: Rei Fujimaki, Tokyo (JP); Minoru Ueshima, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/420,413

(22) PCT Filed: Jul. 29, 2013

(86) PCT No.: PCT/JP2013/070473
§ 371 (c)(1),
(2) Date: Feb. 9, 2015

(87) PCT Pub. No.: WO2014/024715
PCT Pub. Date: Feb. 13, 2014

(65) Prior Publication Data
US 2015/0217410 A1 Aug. 6, 2015

(30) Foreign Application Priority Data
Aug. 10, 2012 (JP) .................. 2012-178846

(51) Int. Cl.
| | |
|---|---|
| B23K 35/28 | (2006.01) |
| B23K 35/26 | (2006.01) |
| C22C 13/02 | (2006.01) |
| C22C 30/02 | (2006.01) |
| C22C 30/04 | (2006.01) |
| C22C 30/06 | (2006.01) |
| B23K 35/02 | (2006.01) |
| H05K 3/34 | (2006.01) |
| B23K 1/00 | (2006.01) |
| C22C 12/00 | (2006.01) |
| B23K 101/40 | (2006.01) |

(52) U.S. Cl.
CPC ............ *B23K 35/28* (2013.01); *B23K 1/0016* (2013.01); *B23K 35/025* (2013.01); *B23K 35/26* (2013.01); *B23K 35/262* (2013.01); *C22C 12/00* (2013.01); *C22C 13/02* (2013.01); *C22C 30/02* (2013.01); *C22C 30/04* (2013.01); *C22C 30/06* (2013.01); *H05K 3/3463* (2013.01); *B23K 2201/40* (2013.01); *H01L 2224/48091* (2013.01); *H01L 2224/48227* (2013.01); *Y10T 403/479* (2015.01)

(58) Field of Classification Search
CPC ...... B23K 1/00; B23K 1/0016; B23K 35/025; B23K 35/22; B23K 35/26; B23K 35/262; B23K 35/28; B23K 2201/40; C22C 12/00; C22C 13/02; C22C 30/02; C22C 30/04; C22C 30/06; H05K 3/3463; H01L 2224/48091; H01L 2224/48227; Y10T 403/479
See application file for complete search history.

(56) References Cited

U.S. PATENT DOCUMENTS

| | | | | |
|---|---|---|---|---|
| 5,019,336 A | * | 5/1991 | Liebermann | ............ C22C 13/00 148/403 |
| 5,900,673 A | | 5/1999 | Nishi et al. | |
| 7,879,455 B2 | | 2/2011 | Kajiwara et al. | |
| 8,865,062 B2 | | 10/2014 | Ueshima et al. | |

FOREIGN PATENT DOCUMENTS

| | | |
|---|---|---|
| JP | 09-57487 | 3/1997 |
| JP | 2003-154485 | 5/2003 |
| JP | 2005-177842 | 7/2005 |
| JP | 2005-340267 | 12/2005 |
| JP | 2005-340268 | 12/2005 |
| JP | 2007-152385 | 6/2007 |
| JP | 5187465 | 4/2013 |

OTHER PUBLICATIONS

Hampshire, W.B., "Tin and Tin Alloys-Solders", ASM Handbook, 1990, ASM International, vol. 2, p. 1-6.*
International Search Report PCT/JP2013/070473 dated Sep. 17, 2013.

\* cited by examiner

*Primary Examiner* — Roy King
*Assistant Examiner* — Caitlin Kiechle
(74) *Attorney, Agent, or Firm* — Young & Thompson

(57) ABSTRACT

Provided is a high-temperature lead-free solder alloy having excellent tensile strength and elongation in a high-temperature environment of 250° C. In order to make the structure of an Sn—Sb—Ag—Cu solder alloy finer and cause stress applied to the solder alloy to disperse, at least one material selected from the group consisting of, in mass %, 0.003 to 1.0% of Al, 0.01 to 0.2% of Fe, and 0.005 to 0.4% of Ti is added to a solder alloy containing 35 to 40% of Sb, 8 to 25% of Ag, and 5 to 10% of Cu, with the remainder made up by Sn.

19 Claims, 7 Drawing Sheets

Sn34Sb5Ag5Cu

Sn37Sb6Cu15Ag0.02Ti

HIGH-TEMPERATURE LEAD-FREE SOLDER ALLOY

TECHNICAL FIELD

The present invention relates to an Sn—Sb—Ag—Cu based, high-temperature lead-free solder alloy.

BACKGROUND ART

In recent years, as higher levels of properties are required of semiconductor elements, their environment of usage also becomes increasingly severe. Therefore, Si (hereinafter referred to as an Si semiconductor element) which has conventionally been used as a semiconductor element material is being replaced by SiC, GaAs, GaN and the like. These are hereinafter referred to as an SiC semiconductor element, a GaAs semiconductor element and a GaN semiconductor element, respectively. Each of the SiC, GaAs and GaN semiconductor elements has excellent properties including an excellent pressure resistance, an achieved increase in operation temperature and an enlarged band gap, and is applied to power transistors and optical devices such as LEDs. These semiconductor elements are called next-generation semiconductors and are required to operate at high temperatures and hence solder joints used therefor may also reach a temperature of about 250 to 280° C. Accordingly, a high-temperature solder for use in such next-generation semiconductors is needed.

Furthermore, in general, a semiconductor element may be connected to a heat sink such as a metal core or a ceramic sheet for heat dissipation and a high-temperature solder is also used for such connection purposes.

Some high-temperature solders have heretofore already been known and an Au-20Sn solder alloy which is an Au—Sn eutectic composition alloy is known as such a conventional high-temperature lead-free solder alloy. The Au-20Sn solder alloy has a eutectic temperature of 250° C. and can be hence used at 250° C. or more but less than 280° C. However, it is a very expensive material.

Exemplary low-cost, high-temperature lead-free solder alloys include an Sn—Sb based solder alloy, a Bi based solder alloy, a Zn based solder alloy and an Ag-containing sintered alloy. Of these, an Sn—Sb based solder alloy is more excellent than a Bi based solder alloy, a Zn based solder alloy and an Ag-containing sintered alloy in terms of thermal conductivity, corrosion resistance and joint strength.

Each of Patent Literatures 1 to 3 discloses an Sn—Sb—Ag—Cu solder alloy obtained by adding Ag and Cu to an Sn—Sb solder alloy, as a high-temperature adder alloy which can also be used in a temperature range of 250 to 280° C.

In other words, each of Patent Literatures 1 to 3 discloses an Sn—Sb—Ag—Cu solder alloy having a solidus temperature in excess of 250° C. in order to improve the heat resistance.

In addition, Patent Literature 4 proposes a solder alloy obtained by adding Fe to an Sn—Sb—Ag—Cu solder alloy in order to improve the heat cycle properties.

CITATION LIST

Patent Literature

Patent Literature 1: JP 2005-340267 A
Patent Literature 2: JP 2007-152385 A
Patent Literature 3: JP 2005-340268 A
Patent Literature 4: JP 2005-177842 A

SUMMARY OF INVENTION

Technical Problems

In general, the cooling rate at the time of soldering is assumed to be about 0.8 to 50° C./sec. According to the recent technical trend of soldering, a considerably low cooling rate of, for example, 1° C./sec may be adopted in common reflow soldering. This condition can be said to be considerably severe as the soldering condition. In the specification, this is collectively referred to as "slow cooling" for convenience sake.

However, in some of the solder alloys disclosed in Patent Literatures 1 to 3, a low melting point phase which melts at 210 to 250° C. is formed by slow cooling in an amount of more than 2%. In these solder alloys, the low melting point phase melts at the operation temperature of a semiconductor element ranging from 250 to 280° C., whereby a solder joint has a low strength portion where solid and liquid coexist. If a load is further applied to the low strength portion, the tensile strength is considerably reduced. Therefore, a solder joint obtained by soldering using a solder alloy having a large amount of a low melting point phase as selected from among the solder alloys disclosed in Patent Literatures 1 to 3 is inferior in joint strength because the low melting point phase melts at 250° C. or more.

In general, in a soldering device, the cooling rate of molten solder is limited within a certain range in view of the device specification and is not an operational factor which is controlled each time soldering is performed. In addition, excessively rapid cooling may apply an unnecessary thermal stress to an electronic device undergoing soldering. Therefore, the following description is based on the premise of slow cooling.

At the operation temperature of a semiconductor element ranging from 250 to 280° C., warpage occurs in the solder joint due to thermal strain between a substrate and a semiconductor component caused by heat generation from the semiconductor element itself.

In general, it is known that, in fracture of a metallic material, dislocations proceed in the vicinities of crystal grain boundaries due to applied strain to cause grain boundary fracture. When stress concentrates on the grain boundaries due to the applied strain and stress resulting therefrom, grain boundary fracture occurs. In contrast, in a case where crystal grain boundaries are finely dispersed, applied stress is reduced because it is dispersed in adjacent grain boundaries. In other words, when a stress is applied, a solder joint obtained by soldering through slow cooling using a solder alloy which may form coarse crystal grains is more likely to cause fracture at grain boundaries of intermetallic compounds of the solder alloy. This is reflected on the tensile strength and elongation which are mechanical properties of the solder alloy. Therefore, a solder joint obtained by soldering using a solder alloy having a coarse structure is inferior in joint strength and elongation compared to a solder joint obtained by soldering using a solder alloy having a fine structure.

The Sn—Sb—Ag—Cu solder alleys disclosed in Patent Literatures 1 to 3 are thus brittle and inferior in elongation and hence solder joints obtained by soldering using these solder alloys are more likely to become brittle and be broken during actual use as a result of slow cooling.

Patent Literature 4 examines an Sn—Sb—P—Ag—Cu—Fe solder alloy in Example 31. However, this solder alloy contains Fe in a considerably large amount of 1% or more. At a high Fe content, slow cooling will, cause Fe-containing intermetallic compounds to be coarsened in the solder alloy. Therefore, this solder alloy is considered to be low in tensile strength and elongation because fracture is more likely to occur at intermetallic compound grain boundaries when a stress is applied.

What is more, as a result of slow cooling, the solder alloy described in Example 31 of Patent Literature 4 is considered to have a solid phase rate at 250° C. of up to 95% and to be turned into a semi-molten state. It is therefore estimated that the joint strength of the solder joint cannot be kept in a usage environment at 250 to 280° C. This is because of the following reasons: The solid phase rate of Sn-40Sb at 250° C. is about 90%; the solid phase rate of Sn-40Sb-7Cu at 250° C. is 95%; and these solder alloys have a solid phase rate of less than 98% and a considerably low tensile strength at 250° C. According to the above, since the solid phase rate is increased by adding 7 wt % of Cu to Sn-40Sb, Cu is considered to have a solid phase rate-increasing effect. The alloy composition of the solder alloy described in Example 31 of Patent Literature 4 is Sn-40Sb-0.1P-1Ag-1Cu-1Fe. The total content of the elements other than Sn and Sb is only 3.1 wt %. Even if Ag, Fe and P have the same effect as Cu in increasing the solid phase rate, the total content of the elements added is less than 7 wt %. Therefore, the solder alloy described in Example 31 of Patent Literature 4 is considered to be inferior in tensile strength at 250° C. because of its lower solid phase rate than Sn-40Sb-7Cu.

An object of the present invention is to provide a high-temperature lead-free solder alloy having excellent tensile strength and elongation even under a high temperature environment of 250° C.

Solution to Problems

To begin with, the inventors of the invention have studied the relation between liquid phase rate and structure in solder alloys and as a result obtained a finding that a solder alloy having a liquid phase rate of up to 2% exhibits a consistently high tensile strength, whereas a solder alloy having a coarse structure exhibits a low elongation value at 250° C. even if the liquid phase rate is up to 2%. Then, the inventors of the invention have made an intensive study on refining an Sn—Sb—Ag—Cu solder alloy structure based on an assumption that the liquid phase rate is up to 2%, in order to improve the tensile strength and the elongation of the solider alloy itself at 250° C. which are indicators of the joint strength and the reliability of a solider joint. As a result, the inventors of the invention have unexpectedly obtained a finding that the structure of the solder alloy can foe refined by adding at least one selected from the group consisting of Al, Ti and Fe in a small amount to an Sn—Sb—Ag—Cu solder alloy. The inventors of the invention have further obtained a finding that Cu3Sn, Cu6Sn5, Ag3Sn and the like are finely dispersed in an SbSn phase by addition of Al, Ti and Fe, thereby achieving a high tensile strength and particularly improving the elongation of the solder alloy, and the present invention has been completed.

The present invention is as follows:

(1) A high-temperature lead-free solder alloy having an alloy composition comprising: 35 to 40 wt % of Sb, 8 to 25 wt % of Ag, 5 to 10 wt % of Cu as well as at least one selected from the group consisting of 0.003 to 1.0 wt % of Al, 0.01 to 0.2 wt % of Fe and 0.005 to 0.4 wt % of Ti, and a balance of Sn.

(2) The high-temperature lead-free solder alloy according to (1) above, further comprising at least one selected from the group consisting of P, Ge and Ga in a total amount of 0.002 to 0.1 wt %.

(3) The high-temperature lead-free solder alloy according to (1) or (2) above, further comprising at least one selected from the group consisting of Ni, Co and Mn in a total amount of 0.01 to 0.5 wt %.

(4) The high-temperature lead-free solder alloy according to any one of (1) to (3) above, further comprising at least one selected from the group consisting of Zn and Bi in a total amount of 0.005 to 0.5 wt %.

(5) The high-temperature lead-free solder alloy according to any one of (1) to (4) above, further comprising at least one selected from the group consisting of Au, Ce, In, Mo, Nb, Pd, Pt, V, Ca, Mg and Zr in a total amount of 0.0005 to 1 wt %.

(6) A solder paste comprising the high-temperature lead-free solder alloy according to any one of (1) to (5) above.

(7) A solder preform comprising the high-temperature lead-free solder alloy according to any one of (1) to (5) above.

(8) A solder joint formed using the high-temperature lead-free solder alloy according to any one of (1) to (5) above.

BRIEF DESCRIPTION OF DRAWINGS

FIG. 6(a) is a micrograph in Example 7, FIG. 6(b) a micrograph in Example 10, FIG. 6(c) a micrograph in Example 14 and FIG. 6(d) a micrograph in Comparative Example 3.

FIG. 7(a) is a micrograph in Example 7, FIG. 7(b) a micrograph in Example 10, FIG. 7(c) a micrograph in Example 14 and FIG. 7(d) a micrograph in Comparative Example 3.

FIG. 8(a) is a micrograph in Example 38, FIG. 8(b) a micrograph in Example 39, and FIG. 8(c) a micrograph in Example 40.

DESCRIPTION OF EMBODIMENTS

Figure 1:
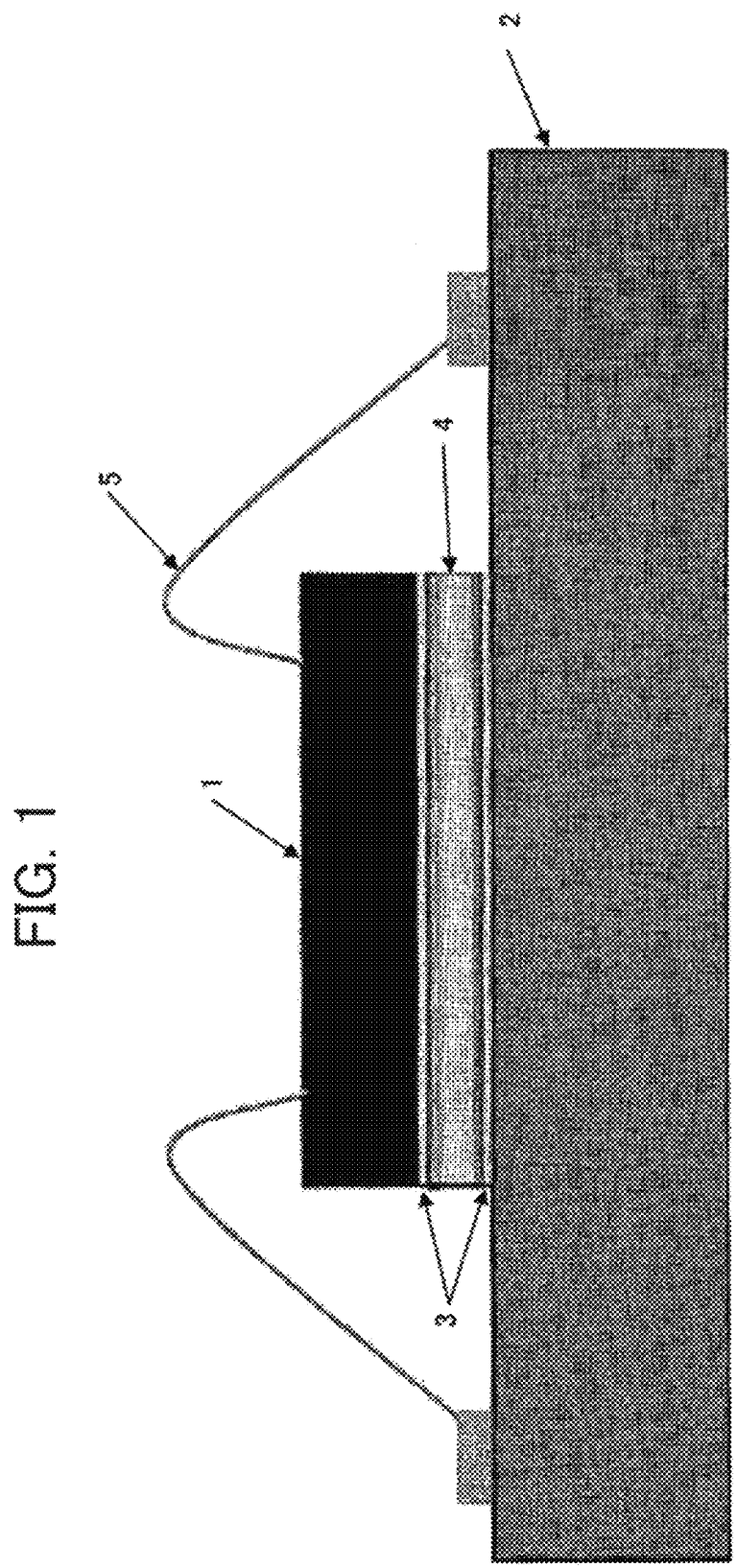
FIG. 1 is a schematic view showing a packaging example of a semiconductor element using a high-temperature lead-free solder alloy according to the invention.

The present invention will be described below in further detail. Unless otherwise specified, "percentage (%)" regarding the solder alloy composition as used in the specification is "percentage by weight."

A high-temperature lead-free solder alloy according to the invention has the alloy composition as described below.

Sb: 35 to 40%

The Sb content is in a range of 35 to 40%. Sb promotes generation of an SbSn phase having a high melting point. Sb suppresses generation of a low melting point phase to increase the solidus temperature. In addition, Sb tends to reduce the surface tension of the solder alloy and hence improves the wettability. At an Sb content of less than 35%, the effect of suppressing generation of a low melting point phase cannot be exhibited and the wettability is also deteriorated. At an Sb content in excess of 40%, the liquidus temperature considerably increases to deteriorate the solderability. The Sb content is preferably in a range of 36 to 40% and more preferably 37 to 40%.

Ag: 8 to 25%

The Ag content is in a range of 8 to 25%. Ag reduces the liquidus temperature to 380° C. or less. Ag generates an intermetallic compound of Sn and Ag3Sn to suppress generation of a low malting point phase, thereby improving the strength of the solder alloy. In addition, Ag reduces the surface tension in a temperature range of up to 400° C. and hence improves the wettability.

At an Ag content of less than 8%, the effect of suppressing generation of a low melting point phase as obtained by addition of Ag cannot be exhibited. At an Ag content in excess of 25%, Sb and Ag preferentially form an Ag3Sb phase and hence the Ag3Sb phase appears at the initial stage of solidification. Therefore, a low melting point phase is store likely to be generated in the solder alloy.

Formation of the Ag3Sb phase from Sb and Ag in the initial stage of solidification relatively reduces the Sb and Ag concentrations in the liquid phase remaining in the process of solidifying the solder alloy. Decreases in concentrations of Sb and Ag in the remaining liquid phase reduce the effect of suppressing generation of a low melting point phase to increase the ratio of the low melting point phase at 250° C. or less. Therefore, the heat resistance of the solder alloy is deteriorated. The Ag content is preferably in a range of 10 to 22% and more preferably 12 to 18%.

Cu: 5 to 10%

The Cu content is in a range of 5 to 10%. Cu controls the liquidus temperature in a range of 340 to 380° C. Cu mainly generates Cu3Sn and Cu6Sn5 to suppress generation of a low melting point phase, thereby improving the tensile strength of the solder alloy.

At a Cu content of less than 5%, the effect of suppressing generation of a low melting point phase as obtained by addition of Cu cannot be exhibited. At a Cu content in excess of 10%, Sb and Cu preferentially form a Cu2Sb phase and hence the Cu2Sb phase appears at the initial stage of solidification of the solder alloy. Therefore, a low melting point phase is more likely to be generated in the solder alloy.

Formation of the Cu2Sb phase from Sb and Cu in the initial stage of solidification of the solder alloy relatively reduces the Sb and Cu concentrations in the liquid phase remaining in the process of solidifying the solder alloy. Decreases in concentrations of Sb and Cu in the remaining liquid phase reduce the effect of suppressing generation of a low molting point phase of Sb and Cu to increase the ratio of the low melting point phase at 250° C. or less. Therefore, the heat resistance of the solder alloy is deteriorated. In addition, the liquidus temperature of the solder alloy is increased to reduce the wettability, thereby reducing the solderability. The Cu content is preferably in a range of 6 to 9% and more preferably 6 to 6%.

The low melting point phase is a solidified phase which is formed by solidification segregation at the time of cooling of the solder alloy after melting and which has a melting point of 210 to 250° C. In general, solidification segregation is a phenomenon in which specific ingredients segregate due to a difference in composition between the first solidified portion and the last solidified portion upon solidification of a molten phase. In general, solidification segregation is more likely to occur with decreasing cooling rate. Particularly in a lead-free solder alloy containing a large amount of Sn, a low-melting-point Sn single phase is more likely to segregate. From such a standpoint, the present invention is characterized by suppressing, in the solder joint, generation of a low melting point phase in which the Sn single phase is considered to be a main ingredient.

The low melting point phase includes the Sn single phase as its main ingredient because the solidus temperature which is the melting point of the low melting point phase is at the same level as the melting point of Sn which is 232° C. The rest of the low melting point phase is considered to be composed of a residual phase having a composition closer to Sb2Sn3 having a melting point of about 240° C. and an Sn—Ag—Cu eutectic composition having a melting point of about 220 to 230° C. Therefore, the solidus temperature which is the melting point of the low melting point phase is considered to be a temperature in a range of 210 to 250° C.

The low melting point phase is generated at least in the case of having such an alloy composition that the Sn content exceeds the total content of Sb, Ag and Cu. In other words, the low melting point phase is generated when Sb+Ag+Cu<Sn is satisfied. The reason why generation of the low melting point phase is suppressed as in the present invention when the Ag content is 8 to 25% and the Cu content is 5 to 10% is considered to be preferential formation of intermetallic compounds of Sb, Ag and Cu with Sn during solidification, thus forming a high melting point phase. However, the precise mechanism thereof is not known.

The high melting point phase as used in the invention is a solidified phase composed of an intermetallic compound showing a melting point of 290° C. or more, as exemplified by Cu6Sn5, Cu3Sn, Ag3Sn, SbSn or Ni3Sn4.

A solder joint for which soldering was performed using the solder alloy according to the invention has these intermetallic compounds each constituting the high melting point phase but may contain other intermetallic compounds than the compounds illustrated above as long as the high melting point phase is a solidified phase showing a melting point of 290° C. or more. In other words, since the solidified phase showing a melting point of 290° C. or more accounts for a large portion of the structure, the solder joint obtained by soldering using the solder alloy according to the invention exhibits excellent heat resistance and tensile strength.

At least one selected from the group consisting of 0.003 to 1.0% of Al, 0.01 to 0.2% of Fe and 0.005 to 0.4% of Ti These elements finely disperse phases respectively composed of intermetallic compounds such as Cu6Sn5, Cu3Sn and Ag3Sn in an SbSn phase to improve the tensile strength and elongation.

In the high-temperature lead-free solder alloy according to the invention, the Sn—Sb—Ag—Cu solder alloy contains Al, Fe and Ti and hence these elements preferentially crystallize during solidification to serve as heterogeneous nucleation seeds, thereby preventing each phase from coarsening. When nucleation of each phase is promoted by heterogeneous nucleation, the number of starting points for nucleation is increased and hence the phases of the intermetallic compounds such as Cu6Sn5, Cu3Sn and Ag3Sn are finely dispersed. Therefore, in the high-temperature lead-free solder alloy according to the invention, the area of the crystal grain boundaries in the solder alloy increases to disperse the stress applied to the grain boundaries and hence various mechanical properties and particularly the elongation are considered to be more significantly improved than a solder alloy in which the respective intermetallic compound phases are coarsened.

Al, Ti and Fe are added in amounts as minute as 0.003 to 1.6%. Therefore, even if a compound having a higher melting point than SbSn is produced as an intermetallic compound containing Sb, Ag and Cu as well as any of Al, Ti and Fe, Sb, Ag and Cu in the solder alloy are not consumed too much. Accordingly, generation of a coarse low melting point phase is suppressed and hence the joint strength of a solder joint is less likely to deteriorate.

The Al content is preferably in a range of 0.01 to 0.8% and more preferably 0.02 to 0.5% in order that the above-described effect may foe sufficiently exhibited. The Fe content is preferably in a range of 0.02 to 0.15% and more preferably 0.02 to 0.1%. The Ti content is preferably in a range of 0.01 to 0.3% and more preferably 0.02 to 0.2%.

If the contents of these elements are less than their lower limit values, there is no effect of refining the solder alloy structure and the tensile strength and elongation are not sufficiently improved. If the contents of these elements exceed their upper limit values, intermetallic compounds containing these elements are coarsened. Therefore, a stress applied to the solder alloy concentrates on the grain boundaries of the intermetallic compounds, thus deteriorating the tensile strength and elongation.

The high-temperature lead-free solder alloy according to the invention may contain the following elements as optional ingredients.

At least one selected from the group consisting of P, Ge and Ga in a total amount of 0.002 to 0.1%

These elements have the effect of improving the wettability by suppressing emergence of oxidizable Al, Fe and Ti on the solder alloy surface during solidification of the solder alloy. Al, Fe and Ti thus remain inside the solder alloy to further promote structure refining by way of the above-described heterogeneous nucleation. As a result, these elements also have the effect of considerably improving the elongation of the solder alloy. The total content of these elements is more preferably in a range of 0.003 to 0.01%. The contents of the respective elements are not particularly limited but in order that the above-described effects may be sufficiently exhibited, the P content is preferably in a range of 0.002 to 0.005%, the Ge content is preferably in a range of 0.002 to 0.006% and the Ga content is preferably in a range of 0.002 to 0.02%.

At least one selected from the group consisting of Ni, Co and Mn in a total amount of 0.01 to 0.5%

These elements suppress diffusion of ingredients of a plated layer formed in a semiconductor element or an external substrate at the time of soldering into the solder alloy. Therefore, these elements have the effect of maintaining the structure of the solder alloy constituting a solder joint while reducing the thickness of an intermetallic compound layer to be formed at the joint interface. Accordingly, these elements can enhance the joint strength of the solder joint. The total content of these elements is more preferably in a range of 0.01 to 0.05%. The contents of the respective elements are not particularly limited but in order that the above-described effect may be sufficiently exhibited, the Ni content is preferably in a range of 0.02 to 0.07%, the Co content is preferably in a range of 0.02 to 0.04% and the Mn content is preferably in a range of 0.02 to 0.05%. Of these elements, Ni is a particularly preferable element as an element exhibiting the above-described effect.

At least one selected from the group consisting of Zn and Bi in a total amount of 0.005 to 0.5%

These elements further increase the solid phase rate of the solder alloy at 280° C. to improve the tensile strength. The total content of these elements is more preferably in a range of 0.005 to 0.4% and most preferably 0.01 to 0.3%. The contents of the respective elements are not particularly limited but in order that the above-described effect may be sufficiently exhibited, the Zn content is preferably in a range of 0.01 to 0.2%, and the Bi content is preferably in a range of 0.02 to 0.3%.

At least one selected from the group consisting of Au, Ce, In, Mo, Nb, Pd, Pt, V, Ca, Mg and Zr in a total amount of 0.0005 to 1%

These elements improve the mechanical ductility at 250° C. as with P, Ge and Ga. These elements are oxidizable and more easily oxidize than Al, Ti and Fe, and have the effect of promoting structure refining as obtained using Al, Ti and Fe by having Al, Ti and Fe remain inside the solder. The total content of these elements is more preferably in a range of 0.01 to 0.03%. The contents of the respective elements are not particularly limited but in order that the above-described effect may be sufficiently exhibited, the contents of Au, Ce, In, Mo, Nb, Pd, Pt, V, Ca, Mg and Zr are each preferably in a range of 0.02 to 0.03%.

The high-temperature lead-free solder alloy according to the invention preferably has a solidus temperature of 280° C. or more and preferably 290° C. or more. The solidus temperature was thus defined for the following reasons:

The solidus temperature was defined to allow the solder joint using the high-temperature lead-free solder alloy according to the invention to have sufficient heat resistance to resist heat generation from an SiC semiconductor element, a GaN semiconductor element and a GaAs semiconductor element which operate at a high temperature of 250° C. or more, to have a solid phase ratio of 98% or more and to ensure good reliability. Another reason for which the solidus temperature is defined to be 280° C. or more and preferably 290° C. or more is that the reflow temperature at the time of joining of another electronic component to a packaging substrate in the subsequent step after a semiconductor element is joined to the packaging substrate may reach 260° C. The solder joint is required to show a solidus temperature of 280° C. or more and preferably 290° C. or more as the temperature capable of coping well with such reflow temperature without remelting. Even in a solder alloy having a solidus temperature of up to 250° C., if the solid phase rate at 280° C. is 98% or more, the mechanical strength and in particular the elongation of the solder joint at 250° C. are good and connection can also be maintained at the time of repeated reflowing.

The "solid phase ratio" as used in the invention refers to a ratio (%) of the area of endothermic peaks as detected at 280° C. or more to the total area of endothermic peaks in a DSC curve as measured at a temperature elevation rate of 5° C./min using a solder alloy solidified at a cooling rate of 1° C./min as the sample.

The high-temperature lead-free solder alloy according to the invention preferably has a liquidus temperature of up to 400° C. The soldering temperature needs to be a temperature elevated above the liquidus temperature. Therefore, at a liquidus temperature above 400° C., the soldering temperature needs to be higher than this temperature but at such a high temperature, the running cost at the time of production is high and the workability is deteriorated. Furthermore, the liquidus temperature is more preferably up to 380° C. from the standpoints of heat resistance of a semiconductor component itself and protection of circuit wiring inside the semiconductor component.

The high-temperature lead-free solder alloy according to the invention can also be used in die bonding of a semiconductor element, in other words, in joining of a semiconductor element to a heat sink. The high-temperature lead-free solder alloy according to the invention can also be applied to soldering of connector terminals and motherboards, to mounting of DIP ICs or the like on printed circuit boards, to assembly and mounting of electronic components such as capacitors, to sealing of ceramic packages, to attachment of leads to diodes and the like, and to solder preforms for semiconductor soldering.

The high-temperature lead-free solder alloy according to the invention can be suitably used in the form of a solder preform or solder paste. Such a preform material is in the shape of a washer, a ring, a pellet, a disk, a ribbon, a wire, a ball or the like.

A solder preform may be used for joining in a reducing atmosphere without using flux. Joining in a reducing atmosphere does not cause contamination of joined portions with flux, so it has the advantages that not only does it become unnecessary to clean the joined portions in a step following the joining but also that voids in solder joints can be greatly decreased.

The high-temperature lead-free solder alloy according to the invention can be used in the form of solder paste. The solder paste is in a paste form and is obtained by mixing solder alloy powder with a small amount of flux. The high-temperature lead-free solder alloy according to the invention may be used in the form of solder paste when mounting electronic components on a printed circuit board by a reflow soldering method. The flux for use in solder paste may be a water-soluble flux or a water-insoluble flux. Typically, a rosin flux which is a rosin-based water-insoluble flux is used.

FIG. 1 is a schematic view showing a packaging example of a semiconductor element using a high-temperature lead-free solder alloy according to the invention. The high-temperature lead-free solder alloy according to the invention may be used as a high-temperature solder alloy for joining (die bonding) a semiconductor element to a heat sink. As shown in FIG. 1, each of a semiconductor element 1 and a heat sink 2 has a plated layer 3 made of Cu, Ni, Ni/Au, Ag, or the like. A high-temperature lead-free solder alloy 4 according to the invention connects the plated layers 3 to each other to form a solder joint.

The solder joint according to the invention is formed using the high-temperature lead-free solder alloy according to the invention. For example, referring to FIG. 1, the solder joint according to the invention includes the plated layers 3 and the solder alloy 4.

As for the conditions for manufacturing the solder joint according to the invention, the cooling rate at the time of solidification is preferably in a range of 0.8 to 50° C./sec. The cooling rate within this range covers the cooling rate in most of currently used soldering devices. Therefore, in a case where the solder alloy according to the invention is used to perform soldering, it is not particularly necessary to make any particular changes to the cooling rate at the time of soldering. Owing to such excellent effects of the invention, even in a case where a semiconductor element is joined to a large-scale printed circuit board or heat sink having a large heat capacity, it is not necessary to change the cooling rate in the high-temperature lead-free solder alloy according to the invention, and soldering is performed under conventional cooling conditions. This is because the high-temperature lead-free solder alloy according to the invention can exhibit excellent connection reliability while suppressing generation of a low melting point phase even when the slow cooling is performed at 0.8° C./sec. The cooling rate is more preferably 1 to 10° C./sec.

The high-temperature lead-free solder alloy according to the invention exhibits its effects particularly in cases where a semiconductor element as described above which operates at a high temperature of about 250 to 280° C. is soldered to a heat sink. As a matter of course, the high-temperature lead-free solder alloy according to the invention does not generate a low melting point phase and can exhibit sufficiently high connection reliability even when used for a solder joint having a required heat resistant temperature of up to 250° C.

The solder alloy according to the invention manufactured using a high purity material or a low alpha material is a low alpha solder alloy. Software errors can be prevented from occurring by using it on the periphery of a memory.

EXAMPLES

Solder alloys having the respective alloy compositions shown in Tables 1 and 2 were melted at 430° C. and then each solder alloy was cooled at a cooling rate of 1° C./sec in order to simulate the formation of each solder joint after soldering. The cooling rate is controlled by a thermocouple which detects the furnace temperature of DSC. To be more specific, the cooling rate of 1° C./sec is a value obtained when a solder alloy having been completely melted at 430° C. is then cooled to 180° C. at a temperature reduction rate of 1° C./sec.

A DSC curve of the cooled solder alloy was obtained by increasing the temperature at 5° C./min in air using DSC (model: Q2000) manufactured by TA Instruments Japan Inc. From the resulting DSC curve, the solidus temperature, the liquidus temperature, the liquid phase rate and the solid phase rate were determined. The results are compiled in Tables 1 and 2.

Figure 2:
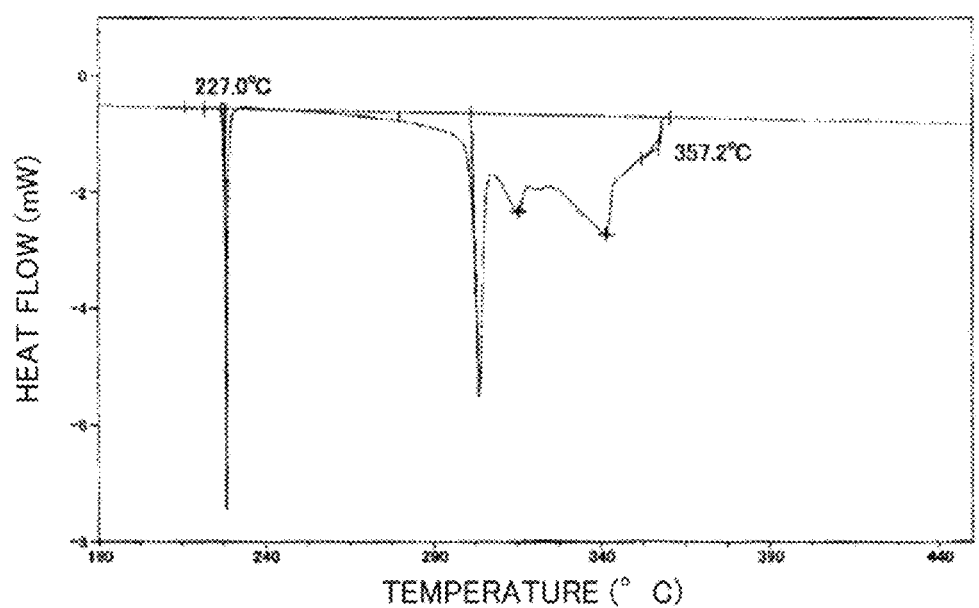
FIG. 2 is a graph showing the DSC curve of a solder alloy in Comparative Example 1.
Figure 3:
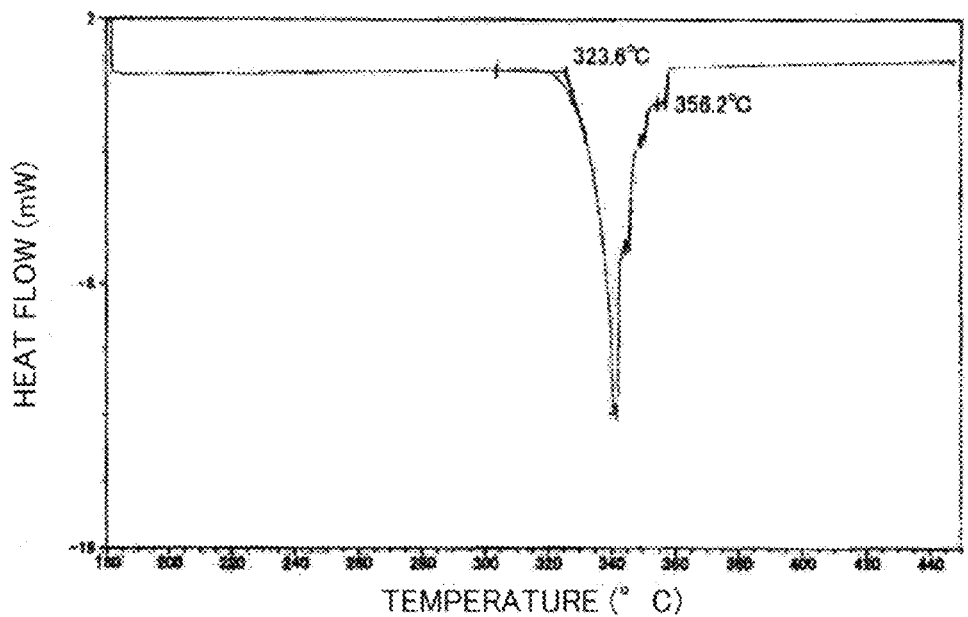
FIG. 3 is a graph showing the DSC curve of a solder alloy in Example 14.

FIG. 2 is a graph showing the DSC curve of a solder alloy in Comparative Example 1. FIG. 3 is a graph showing the DSC curve of a solder alloy in Example 14. These DSC curves are obtained by increasing the temperature of the solder alloys solidified at a cooling rate of 1° C./sec at 5° C./min.

In the DSC curve shown in FIG. 2, the temperature at the start of endotherm of the first endothermic peak is the solidus temperature, and the temperature at the completion of endotherm of the last endothermic peak is the liquidus temperature. However, in a case where there is only one endothermic peak as shown in FIG. 3, the temperature at the start of endotherm of the endothermic peak is the solidus temperature, and the temperature at the completion of endotherm of this endothermic peak is the liquidus temperature.

As is clear from FIG. 2, in the solder alloy of Comparative Example 1 in which the alloy composition is outside the range of the invention, two endothermic peaks were observed, and the solidus temperature shown was 227° C. On the other hand, as is clear from FIG. 3, in the solder alloy of Example 14 in which the alloy composition is within the range of the invention, only one endothermic peak was observed, and the solidus temperature shown was 323° C.

In the alloy compositions shown in Comparative Examples except Comparative Examples 4, 5 and 10, an endothermic peak was observed at a temperature below 280° C.

Figure 4:
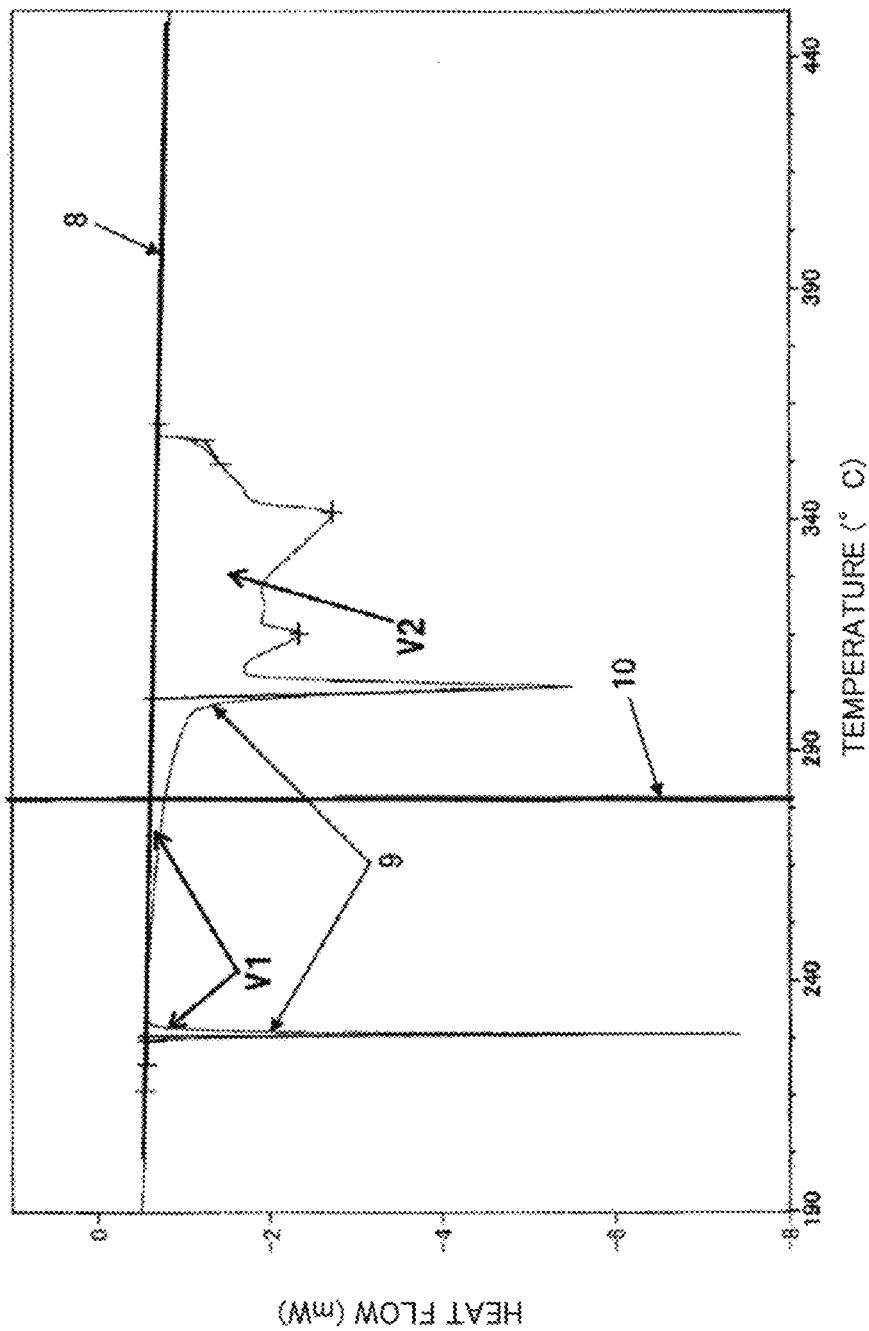
FIG. 4 is a graph showing the DSC curve of the solder alloy in Comparative Example 1 indicating methods of calculating the liquid phase rate and the solid phase rate.

Methods of calculating the liquid phase rate and the solid phase rate will be described in detail, taking the DSC curve in Comparative Example 1 as shown in FIG. 4 as an example.

The liquid phase rate at 280° C. was determined as follows: First, as shown in FIG. 4, a baseline 8 was drawn, and the area $V_0 (V_0 = V_1 + V_2)$ surrounded by the baseline 8 and a DSC curve 9 was determined. A dividing line 10 was then drawn at 280° C. and the area $V_1$ surrounded by the dividing line 10, the DSC curve 9 at 280° C. or less and the baseline 8 was determined. Finally, the liquid phase rate (percentage) at 280° C. was calculated by $(V_1/V_0) \times 100$. On the other hand, in a case where no endothermic peak was observed at a temperature of 280° C. or less as shown in FIG. 3, the area $V_1$ is 0 and hence the liquid phase rate at 280° C. becomes 0%.

The solid phase rate at 280° C. was determined as follows: The area $V_2$ surrounded by the dividing line 10, the DSC curve 9 at 280° C. or more and the baseline 8 as shown in FIG. 4 was determined. The liquid phase rate at 280° C. was then calculated by $(V_2/V_0) \times 100$ to obtain the solid phase rate. On the other hand, in a case where an endothermic peak was observed only at 280° C. or more as shown in FIG. 3, $V_2$ is equal to $V_0$, so the solid phase rate at 280° C. becomes 100%. The measurement results are shown in Tables 1 and 2.

In addition, a solder alloy having each alloy composition shown in Tables 1 and 2 was cast into a mold to prepare a specimen having a predetermined shape. Methods of measuring the tensile strength and the elongation at break are as described below.

Figure 5:
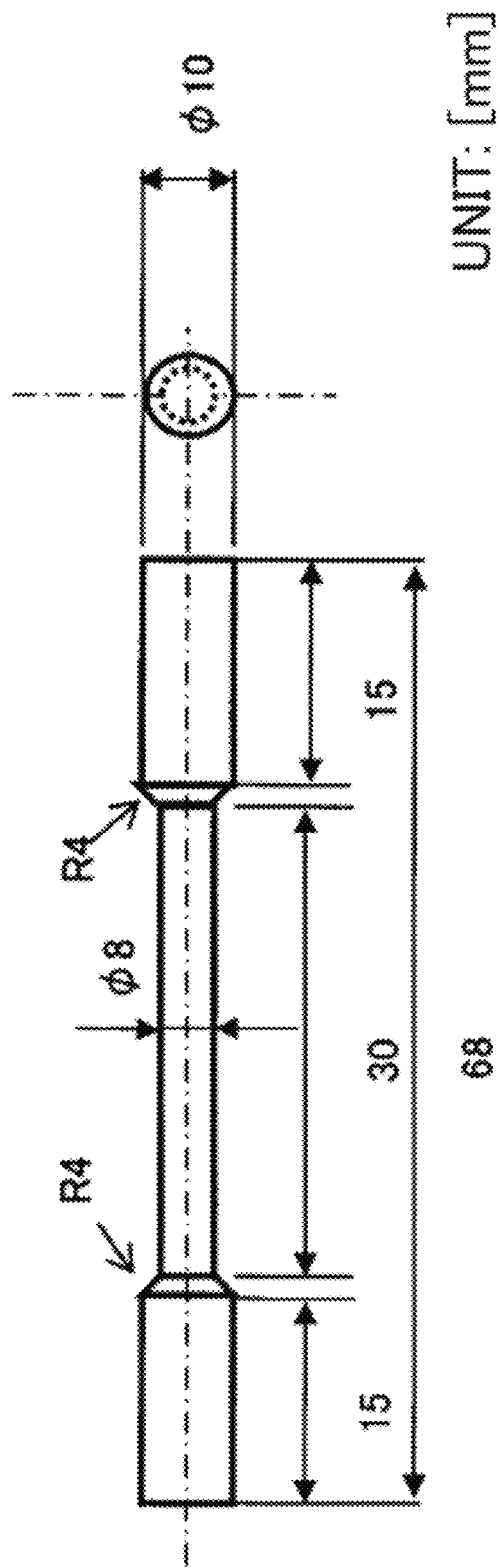
FIG. 5 is a cross-sectional view of a specimen used in a tensile test.

A specimen has a shape shown in FIG. 5. Its parallel portion has dimensions of 8 mm in diameter (φ) and 30 mm in length. The specimen was obtained by melting each solder alloy at the liquidus temperature of each composition+100° C., casting the molten solder alloy into a split mold made by working according to the above-described dimensions, cooling the cast solder alloy with air until the temperature decreases to room temperature and taking the cooled solder alloy out of the split mold. A thermocouple was attached to the casting portion of the split mold and the temperature history during solidification was measured. As a result, the cooling rate was about 1 to 3° C./sec. A tensile test was performed in a thermostatic chamber at 250° C. in air at a crosshead speed of 0.09 mm/min using Autograph 5966 manufactured by Instron.

The tensile strength and the elongation at break were calculated from the load and the displacement values read from a load cell of the tensile tester. According to the invention, in a case where a solder alloy showed a tensile strength of 5 MPa or more and an elongation at break of 5% or more, the solder alloy was deemed to have sufficient mechanical properties to prevent easy fracture at high temperature even when used for a solder joint.

TABLE 1

| | Alloy composition [%] | | | | | | | | | | | | | | | | | | |
|---|---|---|---|---|---|---|---|---|---|---|---|---|---|---|---|---|---|---|---|
| | Sn | Sb | Ag | Cu | Al | Fe | Ti | P | Ge | Ga | Co | Mn | Ni | Bi | Zn | In | V | Ca | Pt |
| Example 1 | bal. | 35 | 8 | 5 | 0.003 | | | | | | | | | | | | | | |
| Example 2 | bal. | 37 | 8 | 7 | 0.01 | | | | | | | | | | | | | | |
| Example 3 | bal. | 37 | 15 | 6 | 0.013 | | | | | | | | | | | | | | |
| Example 4 | bal. | 37 | 8 | 7 | 0.03 | | | | | | | | | | | | | | |
| Example 5 | bal. | 40 | 20 | 8 | 0.08 | | | | | | | | | | | | | | |
| Example 6 | bal. | 35 | 15 | 5 | 0.11 | | | | | | | | | | | | | | |
| Example 7 | bal. | 37 | 8 | 7 | 0.33 | | | | | | | | | | | | | | |
| Example 8 | bal. | 37 | 15 | 8 | 1 | | | | | | | | | | | | | | |
| Example 9 | bal. | 37 | 8 | 7 | | 0.01 | | | | | | | | | | | | | |
| Example 10 | bal. | 37 | 15 | 8 | | 0.02 | | | | | | | | | | | | | |
| Example 11 | bal. | 37 | 8 | 7 | | 0.045 | | | | | | | | | | | | | |
| Example 12 | bal. | 40 | 20 | 8 | | 0.1 | | | | | | | | | | | | | |
| Example 13 | bal. | 37 | 8 | 7 | | | 0.005 | | | | | | | | | | | | |
| Example 14 | bal. | 37 | 15 | 6 | | | 0.02 | | | | | | | | | | | | |
| Example 15 | bal. | 37 | 8 | 7 | | | 0.04 | | | | | | | | | | | | |
| Example 16 | bal. | 40 | 20 | 8 | | | 0.2 | | | | | | | | | | | | |
| Example 17 | bal. | 36 | 15 | 6 | 0.01 | | | 0.003 | | | | | | | | | | | |
| Example 18 | bal. | 35 | 15 | 5 | 0.085 | | | 0.003 | | | | | | | | | | | |
| Example 19 | bal. | 36 | 15 | 5 | 0.015 | | | | 0.005 | | | | | | | | | | |
| Example 20 | bal. | 36 | 15 | 6 | 0.01 | | | | | 0.01 | | | | | | | | | |
| Example 21 | bal. | 37 | 15 | 6 | 0.08 | | | | | | 0.04 | | | | | | | | |
| Example 22 | bal. | 37 | 15 | 6 | 0.05 | | | | | | | 0.02 | | | | | | | |
| Example 23 | bal. | 37 | 15 | 6 | 0.08 | | | | | | | | 0.03 | | | | | | |
| Example 24 | bal. | 37 | 15 | 6 | 0.1 | | | | | | | | | 0.3 | | | | | |
| Example 25 | bal. | 37 | 15 | 6 | 0.007 | | | | | | | | | | 0.3 | | | | |
| Example 26 | bal. | 37 | 15 | 5 | 0.003 | | | | | | | | | | | 0.9 | | | |
| Example 27 | bal. | 37 | 15 | 6 | 0.01 | | | | | | | | | | | | 0.005 | | |
| Example 28 | bal. | 37 | 15 | 6 | 0.008 | | | | | | | | | | | | | 0.1 | |
| Example 29 | bal. | 37 | 15 | 6 | 0.004 | | | | | | | | | | | | | | 0.0098 |
| Example 30 | bal. | 37 | 15 | 6 | 0.05 | | | | | | | | | | | | | | |
| Example 31 | bal. | 35 | 15 | 6 | 0.003 | | | | | | | | | | | | | | |

| | Alloy composition [%] | | | | | | | Solidus temp. [° C.] | Liquidus temp. [° C.] | Liquid phase rate [° C.] | Solid phase rate [° C.] | Tensile strength [Mpa] | Elongation at break [%] |
|---|---|---|---|---|---|---|---|---|---|---|---|---|---|
| | Pd | Ce | Mo | Nb | Zr | Mg | Au | | | | | | |
| Example 1 | | | | | | | | 228.4 | 380.3 | 1.5 | 98.5 | 26.9 | 5.3 |
| Example 2 | | | | | | | | 300.2 | 358.9 | 0.0 | 100.0 | 33.3 | 36.9 |
| Example 3 | | | | | | | | 297.7 | 357.0 | 0.0 | 100.0 | 29.9 | 40.2 |
| Example 4 | | | | | | | | 300.8 | 359.5 | 0.0 | 100.0 | 12.9 | 45.6 |

TABLE 1-continued

| Example | | | Solidus temp. | Liquidus temp. | Liquid phase rate | Solid phase rate | Tensile strength | Elongation at break |
|---|---|---|---|---|---|---|---|---|
| Example 5 | | | 338.2 | 375.1 | 0.0 | 100.0 | 26.0 | 72.9 |
| Example 6 | | | 227.8 | 348.2 | 1.9 | 98.1 | 17.5 | 124.0 |
| Example 7 | | | 298.5 | 358.8 | 0.0 | 100.0 | 14.1 | 85.7 |
| Example 8 | | | 228.6 | 359.8 | 1.9 | 98.1 | 14.2 | 24.1 |
| Example 9 | | | 304.6 | 358.9 | 0.0 | 100.0 | 33.2 | 35.2 |
| Example 10 | | | 326.1 | 356.5 | 0.0 | 100.0 | 30.9 | 39.1 |
| Example 11 | | | 303.9 | 358.5 | 0.0 | 100.0 | 38.3 | 11.9 |
| Example 12 | | | 327.6 | 373.6 | 0.0 | 100.0 | 38.7 | 75.1 |
| Example 13 | | | 301.3 | 359.0 | 0.0 | 100.0 | 34.7 | 53.1 |
| Example 14 | | | 323.6 | 356.2 | 0.0 | 100.0 | 32.2 | 117.9 |
| Example 15 | | | 301.0 | 358.6 | 0.0 | 100.0 | 12.6 | 74.2 |
| Example 16 | | | 328.6 | 375.2 | 0.0 | 100.0 | 33.4 | 96.8 |
| Example 17 | | | 324.7 | 354.7 | 0.0 | 100.0 | 30.1 | 112.3 |
| Example 18 | | | 227.3 | 346.9 | 1.5 | 98.5 | 11.0 | 346.0 |
| Example 19 | | | 322.2 | 356.7 | 0.0 | 100.0 | 28.7 | 63.3 |
| Example 20 | | | 322.1 | 358.2 | 0.0 | 100.0 | 27.7 | 71.2 |
| Example 21 | | | 299.3 | 348.1 | 0.0 | 100.0 | 18.7 | 134.9 |
| Example 22 | | | 301.0 | 350.1 | 0.0 | 100.0 | 20.0 | 181.7 |
| Example 23 | | | 299.5 | 356.4 | 0.0 | 100.0 | 19.5 | 120.5 |
| Example 24 | | | 227.6 | 351.4 | 0.7 | 99.3 | 13.4 | 26.5 |
| Example 25 | | | 228.9 | 352.3 | 0.3 | 99.7 | 20.9 | 272.0 |
| Example 26 | | | 221.6 | 346.1 | 1.3 | 98.7 | 8.6 | 209.1 |
| Example 27 | | | 304.4 | 358.0 | 0.0 | 100.0 | 25.5 | 153.6 |
| Example 28 | | | 225.6 | 358.5 | 0.4 | 99.6 | 27.5 | 23.9 |
| Example 29 | | | 300.3 | 365.9 | 0.0 | 100.0 | 23.6 | 43.0 |
| Example 30 | 0.015 | | 305.1 | 358.7 | 0.0 | 100.0 | 23.5 | 102.6 |
| Example 31 | | 0.049 | 324.2 | 380.0 | 0.0 | 100.0 | 28.0 | 125.6 |

TABLE 2

| | Alloy composition [%] | | | | | | | | | | | | | | | | | |
|---|---|---|---|---|---|---|---|---|---|---|---|---|---|---|---|---|---|---|
| | Sn | Sb | Ag | Cu | Al | Fe | Ti | P | Ge | Ga | Co | Mn | Ni | Bi | Zn | In | V | Ca | Pt |
| Example 32 | bal. | 37 | 15 | 6 | 0.003 | | | | | | | | | | | | | | |
| Example 33 | bal. | 37 | 15 | 6 | 0.03 | | | | | | | | | | | | | | |
| Example 34 | bal. | 37 | 15 | 6 | 0.03 | | | | | | | | | | | 0.1 | | | |
| Example 35 | bal. | 37 | 15 | 6 | 0.009 | | | | | | | | | | | | | | |
| Example 36 | bal. | 37 | 15 | 6 | 0.04 | | | | | | | | | | | | | | |
| Example 37 | bal. | 40 | 20 | 8 | 0.046 | 0.003 | 0.003 | 0.002 | 0.004 | 0.09 | 0.01 | 0.016 | 0.05 | 0.044 | 0.53 | 0.03 | 0.012 | 0.04 | 0.012 |
| Comparative Example 1 | bal. | 34 | 5 | 5 | | | | | | | | | | | | | | | |
| Comparative Example 2 | bal. | 35 | 8 | 5 | | | | | | | | | | | | | | | |
| Comparative Example 3 | bal. | 35 | 15 | 5 | | | | | | | | | | | | | | | |
| Comparative Example 4 | bal. | 37 | 8 | 7 | | | | | | | | | | | | | | | |
| Comparative Example 5 | bal. | 40 | 20 | 6 | | | | | | | | | | | | | | | |
| Comparative Example 6 | bal. | 37 | 8 | 7 | 0.25 | | | | | | | | | | | | | | |
| Comparative Example 7 | bal. | 37 | 8 | 7 | | 0.43 | | | | | | | | | | | | | |
| Comparative Example 8 | bal. | 35 | 8 | 5 | 0.002 | | | | | | | | | | | | | | |
| Comparative Example 9 | bal. | 37 | 15 | 6 | 1.14 | | | | | | | | | | | | | | |
| Comparative Example 10 | bal. | 37 | 8 | 7 | | 0.006 | | | | | | | | | | | | | |
| Comparative Example 11 | bal. | 35 | 8 | 5 | | | 0.004 | | | | | | | | | | | | |

| | Alloy composition [%] | | | | | | | Solidus temp. [° C.] | Liquidus temp. [° C.] | Liquid phase rate [° C.] | Solid phase rate [° C.] | Tensile strength [Mpa] | Elongation at break [%] |
|---|---|---|---|---|---|---|---|---|---|---|---|---|---|
| | Pd | Ce | Mo | Nb | Zr | Mg | Au | | | | | | |
| Example 32 | | | 0.0025 | | | | | 326.0 | 360.4 | 0.0 | 100.0 | 31.8 | 66.8 |
| Example 33 | | | | 0.003 | | | | 225.7 | 358.4 | 0.0 | 100.0 | 13.3 | 6.0 |
| Example 34 | | | | | 0.0008 | | | 224.0 | 354.2 | 0.5 | 99.5 | 31.3 | 8.9 |
| Example 35 | | | | | | 0.0045 | | 226.6 | 354.7 | 0.5 | 99.5 | 28.2 | 56.7 |
| Example 36 | | | | | | | 0.02 | 225.5 | 358.0 | 0.2 | 99.8 | 29.3 | 33.2 |
| Example 37 | 0.03 | 0.02 | 0.023 | 0.002 | 0.0007 | 0.002 | 0.01 | 333.5 | 375.0 | 0.0 | 100.0 | 29.3 | 140.8 |
| Comparative Example 1 | | | | | | | | 227.0 | 357.2 | 8.8 | 91.2 | 0.6 | 2.1 |

TABLE 2-continued

| | | | | | | |
|---|---|---|---|---|---|---|
| Comparative Example 2 | | 228.4 | 382.9 | 2.2 | 97.8 | 3.2 | 1.1 |
| Comparative Example 3 | | 226.9 | 356.9 | 0.4 | 99.6 | 29.9 | 1.8 |
| Comparative Example 4 | | 303.2 | 359.2 | 0.0 | 100.0 | 35.1 | 2.8 |
| Comparative Example 5 | | 336.9 | 375.3 | 0.0 | 100.0 | 28.9 | 1.9 |
| Comparative Example 6 | | 226.4 | 359.1 | 2.7 | 97.3 | 15.4 | 0.3 |
| Comparative Example 7 | | 227.2 | 359.4 | 3.0 | 97.0 | 13.1 | 0.3 |
| Comparative Example 8 | | 227.9 | 362.8 | 2.4 | 97.6 | 4.5 | 1.8 |
| Comparative Example 9 | | 228.5 | 359.6 | 3.7 | 96.3 | 12.8 | 3.2 |
| Comparative Example 10 | | 302.8 | 359.2 | 0.0 | 100.0 | 33.2 | 2.9 |
| Comparative Example 11 | | 229.1 | 362.3 | 1.5 | 98.5 | 7.7 | 1.2 |

Each of Examples 1 to 37 in which the alloy composition is within the range of the invention showed a solid phase rate of 98% or more, a liquidus temperature of up to 376° C., a tensile strength at 250° C. of 5 MPa or more, and an elongation at break of 5% or more. On the other hand, each of Comparative Examples 1 to 11 in which Al, Fe and Ti are not contained or Al, Fe and Ti are contained in amounts outside the ranges of the invention only showed an elongation at break value of less than 4%. For example, each of Comparative Examples 3, 4, 5, 10 and 11 shows a solid phase rate at 250° C. of 98% or more, thus satisfying sufficient heat resistance but shows an elongation at break at 250° C. of less than 3%, thus not satisfying mechanical ductility. However, in Examples 2, 4, 5, 6, 7, 9, 11, 12, 13, 15, 16, 18 and 37 in which Al, Fe or Ti is added in a specific amount, the mechanical ductility is considerably improved.

Comparative Examples 1 to 5 in which Al, Fe or Ti is not contained each have an elongation at break of up to 3% although some of them show a high tensile strength. Comparative Examples 6 to 11 in which the Al, Fe and Ti contents are outside the ranges of the invention each have a low elongation at break value although some of them show a high tensile strength.

FIGS. 6(a) to 6(d) are each a micrograph of a fracture surface of a specimen as taken by an optical microscope; FIG. 6(a) is a micrograph in Example 7, FIG. 6(b) a micrograph in Example 10, FIG. 6(c) a micrograph in Example 14 and FIG. 6(d) a micrograph in Comparative Example 3. The micrographs shown in FIGS. 6(a) to 6(d) are taken at a to magnification of 20×.

Figure 7:
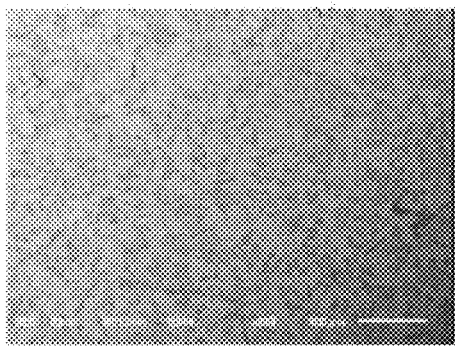
FIGS. 7(a) to 7(d) are each a micrograph of a fracture surface of a specimen as taken by an electron microscope.
Figure 7:
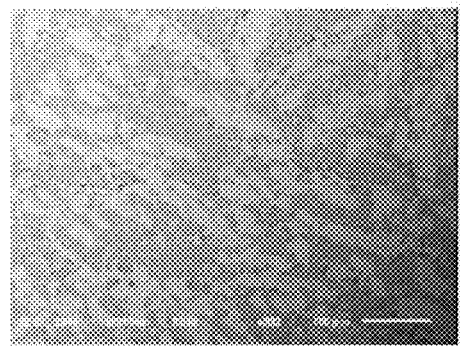
Figure 7:
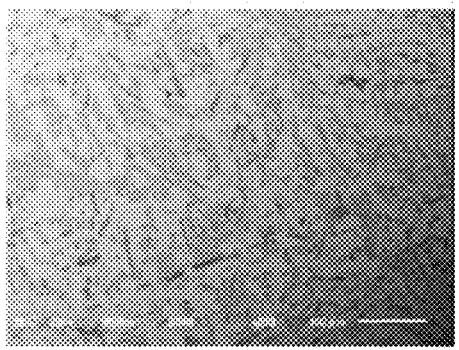
Figure 7:
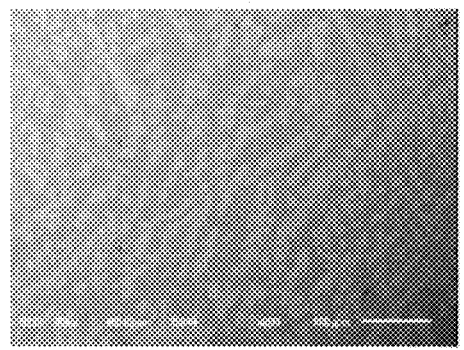

FIGS. 7(a) to 7(d) are each a micrograph of a fracture surface of a specimen as taken by an electron microscope; FIG. 7(a) is a micrograph in Example 7, FIG. 7(b) a micrograph in Example 10, FIG. 7(c) a micrograph in Example 14 and FIG. 7(d) a micrograph in Comparative Example 3. The micrographs shown in FIGS. 7(a) to 7(d) are taken at a magnification of 200×.

Figure 6:
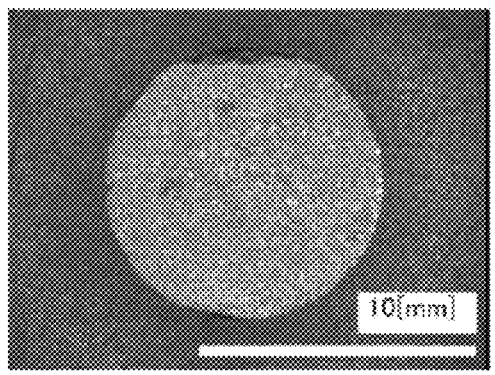
FIGS. 6(a) to 6(d) are each a micrograph of a fracture surface of a specimen as taken by an optical microscope.
Figure 6:
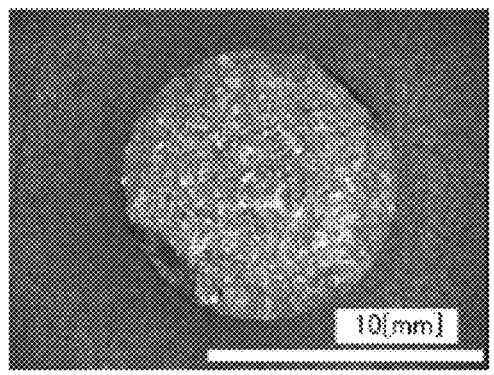
Figure 6:
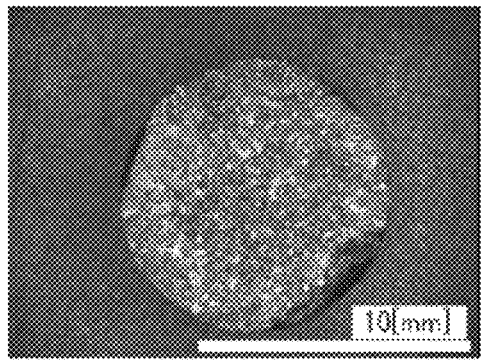
Figure 6:
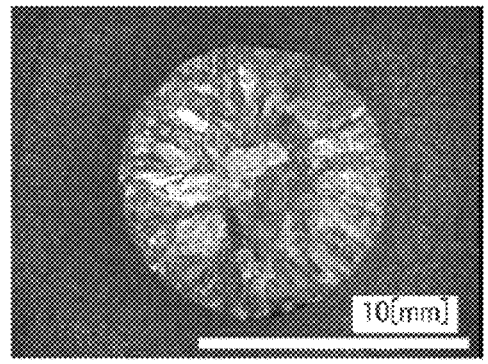

As shown in FIGS. 6(a) to 6(d), it was revealed that grain regions surrounded by cracks seen in the fracture surface in FIGS. 6(a) to 6(c) are clearly smaller in size than those in FIG. 6 (d). It was also revealed that phases of intermetallic compounds such as Ag3Sn and Cu3Sn are finely dispersed in an SbSn phase in FIGS. 7(a) to 7(c), whereas an SbSn phase and coarse phases of intermetallic compounds such as Ag3Sn and Cu3Sn form a lamellar structure in FIG. 7(d).

In the high-temperature lead-free solder alloy according to the invention, the phases of Ag3Sn, Cu6Sn5, Cu3Sn and the like are finely dispersed in the SbSn phase as shown in FIGS. 7(a) to 7(c) to increase the area of crystal grain boundaries, thereby reducing the concentration of stress. Therefore, the grain regions surrounded by the cracks seen in the fracture surface as shown in FIGS. 6(a) to 6(c) are considered to be smaller in size than the grain regions surrounded by the cracks seen in the fracture surface as shown in FIG. 6(d).

The high-temperature lead-free solder alloy according to the invention can thus reduce the concentration of stress due to strain while suppressing the fracture of each grain boundary and hence is considered to show excellent tensile strength and elongation at break.

In addition, each solder alloy according to the invention was used to form a solder joint on a heat sink and the state of the joint interface between the solder alloy and the heat sink was examined.

TABLE 3

| | Alloy composition [%] | | | | | | Solidus temperature [° C.] | Liquidus temperature [° C.] | Liquid phase rate [° C.] | Solid phase rate [° C.] | Thickness of IMC layer [μm] |
|---|---|---|---|---|---|---|---|---|---|---|---|
| | Sn | Sb | Ag | Cu | Al | Ni | | | | | |
| Example 38 | bal. | 37 | 15 | 6 | 0.02 | 0 | 328.0 | 358.4 | 0.0 | 100.0 | 4.0 |
| Example 39 | bal. | 37 | 15 | 6 | 0.02 | 0.03 | 326.0 | 358.6 | 0.0 | 100.0 | 3.5 |
| Example 40 | bal. | 37 | 15 | 6 | 0.02 | 0.07 | 327.0 | 358.7 | 0.0 | 100.0 | 2.3 |

Each of Examples 38, 39 and 40 in which the alloy composition is within the range of the invention shows a solid phase rate of 100% and a liquidus temperature of up to 376° C., and has good heat resistance. Moreover, since the Al content is within the range of the invention, the mechanical strength and the ductility are also obviously satisfied. In addition, an intermetallic compound layer (IMC) formed at the joint interface with the heat sink is thinner in Examples 39 and 40 than in Example 38 in which Ni is not contained. It is commonly known that the joint reliability reduces at the joint interface between the solder alloy and the heat sink if the intermetallic compound layer formed in the vicinity of the joint interface has a large thickness. In other words, by further adding Ni to a solder alloy obtained by incorporating Al, Ti and Fe in an Sn—Sb—Ag—Cu alloy within the scope of the invention, the intermetallic compound layer can be prevented from having an increased thickness, thereby further improving the joint reliability.

Figure 8:
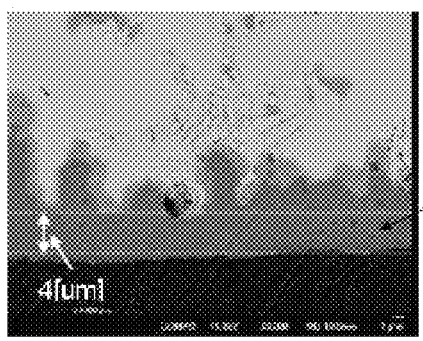
FIGS. 8(a) to 8(c) are each a micrograph of a cross-sectional surface of a joint interface between a high-temperature lead-free solder alloy of the invention and a Cu heat sink as taken by an electron microscope.
Figure 8:
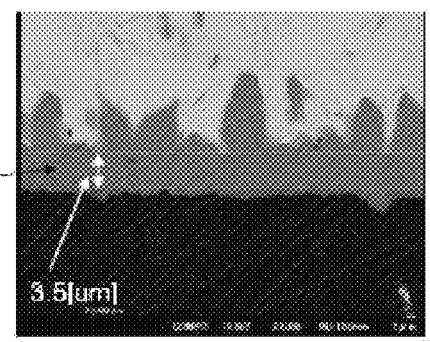
Figure 8:
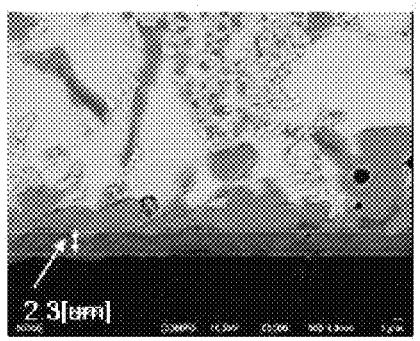

FIGS. 8(a) to 8(c) are each a micrograph of a cross-sectional surface of a joint interface between a high-temperature lead-free solder alloy of the invention and a Cu heat sink as taken by an electron microscope. The Cu heat sink has a size of 30×20×2 mm and is made of Cu. An Si chip has a size of 5×5×0.5 mm and joint electrode portions are flash-plated with Ni/Au.

Reflow soldering was performed by applying proper flux to the central portion of a Cu heat sink, putting solder alloy having a weight of about 10 mg on the flux and mounting an Si chip thereon. Joining conditions are as follows. A vacuum H$_2$ soldering device manufactured by Shinko Seiki Co., Ltd. was used; temperature elevation rate: 1.8 [° C./sec]; peak temperature: 367 [° C.]; solder alloy melting time: 80 seconds; and cooling rate: 1.7 [° C./sec].

FIG. 8(a) is an electron micrograph of a cross-sectional surface of a joint interface between a solder alloy in Example 38 (Sn-37% Sb-6% Cu-15% Ag-0.02% Al) and a Cu heat sink; FIG. 8(b) is an electron micrograph of a cross-sectional surface of a joint interface between a solder alloy in Example 39 (Sn-37% Sb-6% Cu-15% Ag-0.02% Al-0.03% Ni) and a Cu heat sink; and FIG. 8(c) is an electron micrograph of a cross-sectional surface of a joint interface between a solder alloy in Example 40 (Sn-37% Sb-6% Cu-15% Ag-0.02% Al-0.07% Ni) and a Cu heat sink.

As shown in FIGS. 8(a) to 8(c), the solder joint in Example 33 forms a CuSb intermetallic compound phase with a thickness of about 4 (μm) at the joint interface with the Cu heat sink. The solder joints using the solder alloys described in Examples 39 and 40 have IMC thicknesses of 3.5 (μm) and 2.3 (μm), respectively. FIGS. 8(a) to 8(c) reveal that liquation of Cu electrode ingredients from the Cu heat sinks into the solder alloys is suppressed and the layers made of various intermetallic compounds as formed at the joint interfaces are thin.

From the above, the high-temperature lead-free solder alloy according to the invention has excellent tensile strength and elongation under a high temperature environment of 250° C. Therefore, the high-temperature lead-free solder alloy according to the invention can reduce thermal stress applied to a solder joint that may be caused by thermal strain due to a difference in coefficient of thermal expansion between each substrate and a joined component. As described above, in the high-temperature lead-free solder alloy according to the invention, the solder joint does not cause fracture with respect to a semiconductor element capable of high temperature operation. The high-temperature lead-free solder alloy according to the invention can also be used without any problem even in such an environment that the solder alloy may be exposed to high temperature.

The invention claimed is:

1. A high-temperature lead-free solder alloy having an alloy composition comprising: 35 to 40 wt % of Sb, 8 to 25 wt % of Ag, 5 to 10 wt % of Cu as well as at least one selected from the group consisting of 0.003 to 1.0 wt % of Al, 0.01 to 0.2 wt % of Fe and 0.005 to 0.4 wt % of Ti, and a balance of Sn.

2. The high-temperature lead-free solder alloy according to claim 1, further comprising at least one selected from the group consisting of P, Ge and Ga in a total amount of 0.002 to 0.1 wt %.

3. The high-temperature lead-free solder alloy according to claim 1, further comprising at least one selected from the group consisting of Ni, Co and Mn in a total amount of 0.01 to 0.5 wt.

4. The high-temperature lead-free solder alloy according to claim 1, further comprising at least one selected from the group consisting of Zn and Bi in a total amount of 0.005 to 0.5 wt %.

5. The high-temperature lead-free solder alloy according to claim 1, further comprising at least one selected from the group consisting of Au, Ce, In, Mo, Nb, Pd, Pt, V, Ca, Mg and Zr in a total amount of 0.0005 to 1 wt %.

6. The high-temperature lead-free solder alloy according to claim 2, further comprising at least one selected from the group consisting of Ni, Co and Mn in a total amount of 0.01 to 0.5 wt %.

7. The high-temperature lead-free solder alloy according to claim 2, further comprising at least one selected from the group consisting of Zn and Bi in a total amount of 0.005 to 0.5 wt %.

8. The high-temperature lead-free solder alloy according to claim 3, further comprising at least one selected from the group consisting of Zn and Bi in a total amount of 0.005 to 0.5 wt %.

9. The high-temperature lead-free solder alloy according to claim 6, further comprising at least one selected from the group consisting of Zn and Bi in a total amount of 0.005 to 0.5 wt %.

10. The high-temperature lead-free solder alloy according to claim 2, further comprising at least one selected from the group consisting of Au, Ce, In, Mo, Nb, Pd, Pt, V, Ca, Mg and Zr in a total amount of 0.0005 to 1 wt %.

11. The high-temperature lead-free solder alloy according to claim 3, further comprising at least one selected from the group consisting of Au, Ce, In, Mo, Nb, Pd, Pt, V, Ca, Mg and Zr in a total amount of 0.0005 to 1 wt %.

12. The high-temperature lead-free solder alloy according to claim 4, further comprising at least one selected from the group consisting of Au, Ce, In, Mo, Nb, Pd, Pt, V, Ca, Mg and Zr in a total amount of 0.0005 to 1 wt %.

13. The high-temperature lead-free solder alloy according to claim 6, further comprising at least one selected from the group consisting of Au, Ce, In, Mo, Nb, Pd, Pt, V, Ca, Mg and Zr in a total amount of 0.0005 to 1 wt %.

14. The high-temperature lead-free solder alloy according to claim 7, further comprising at least one selected from the group consisting of Au, Ce, In, Mo, Nb, Pd, Pt, V, Ca, Mg and Zr in a total amount of 0.0005 to 1 wt %.

15. The high-temperature lead-free solder alloy according to claim 8, further comprising at least one selected from the group consisting of Au, Ce, In, Mo, Nb, Pd, Pt, V, Ca, Mg and Zr in a total amount of 0.0005 to 1 wt %.

16. The high-temperature lead-free solder alloy according to claim 9, further comprising at least one selected from the group consisting of Au, Ce, In, Mo, Nb, Pd, Pt, V, Ca, Mg and Zr in a total amount of 0.0005 to 1 wt %.

17. A solder paste comprising the high-temperature lead-free solder alloy according to claim 1.

18. A solder preform comprising the high-temperature lead-free solder alloy according to claim 1.

19. A solder joint formed using the high-temperature lead-free solder alloy according to claim 1.

\* \* \* \* \*